United States Patent
Nakazawa et al.

(10) Patent No.: US 7,783,824 B2
(45) Date of Patent: Aug. 24, 2010

(54) DATA PROCESSING DEVICE HAVING FLASH ROM, AND A FLASH ROM DATA ERASING METHOD

(75) Inventors: Masanao Nakazawa, Chikuma (JP); Atsushi Natsuno, Matsumoto (JP); Mitsuaki Teradaira, Shiojiri (JP)

(73) Assignee: Seiko Epson Corporation, Tokyo (JP)

(*) Notice: Subject to any disclaimer, the term of this patent is extended or adjusted under 35 U.S.C. 154(b) by 765 days.

(21) Appl. No.: 11/592,103

(22) Filed: Nov. 1, 2006

(65) Prior Publication Data
US 2007/0103989 A1 May 10, 2007

(30) Foreign Application Priority Data
Nov. 8, 2005 (JP) ............ 2005-323978

(51) Int. Cl.
*G06F 12/00* (2006.01)
(52) U.S. Cl. .......... 711/103; 711/170; 711/172; 711/E12.002

(58) Field of Classification Search ............ None
See application file for complete search history.

(56) References Cited

U.S. PATENT DOCUMENTS

| 6,463,516 | B1* | 10/2002 | Leong et al. ............ 711/170 |
| 2004/0057306 | A1* | 3/2004 | Roohparvar ............ 365/200 |
| 2005/0286855 | A1 | 12/2005 | Saitou et al. | |

FOREIGN PATENT DOCUMENTS

| JP | 2004-094342 A | 3/2004 |
| JP | 2004-342090 | 12/2004 |

* cited by examiner

*Primary Examiner*—Shawn X Gu
(74) *Attorney, Agent, or Firm*—Nutter McClennen & Fish LLP; John J. Penny, Jr.; Michael P. Visconti, III

(57) ABSTRACT

A data processing device 1 has flash ROM having a plurality of sectors, and a CPU for erasing data stored in a predetermined area of the flash ROM. A plurality of erase areas is set in the flash ROM based on the sector structures of a plurality of flash ROM devices. The CPU erases data using the erase areas set in flash ROM.

13 Claims, 6 Drawing Sheets

DATA PROCESSING DEVICE HAVING FLASH ROM, AND A FLASH ROM DATA ERASING METHOD

The present application claims benefit from Japanese Application No. 2005-323978 filed on Nov. 8, 2005, which is hereby incorporated by reference in its entirety.

BACKGROUND OF THE INVENTION

1. Technical Field

The present invention relates to a data processing device having flash ROM and to a method of erasing data from a flash ROM device, and relates more particularly to a control method for erasing a flash ROM by data sector.

2. Related Art

Flash ROM is commonly used in modern personal computers and printers, which are examples of data processing devices. Flash ROM is a type of electrically rewritable non-volatile memory, and in printers, for example, is commonly used to store programs (firmware) controlling the startup process and various control tasks, initialization values that are set during the startup process, and font data.

As shown in FIG. 2, flash ROM is internally segmented into multiple storage areas called "sectors." Data is written to flash ROM devices by sector unit, and writing data involves first erasing all data in a sector before writing data to the erased sector. All sectors in a flash ROM device are not necessarily the same size, and flash ROM is typically divided into sectors of various sizes determined by the capacity and type of flash ROM.

Methods of determining the sector structure of a flash ROM device include using an electric signature to confirm the manufacturer and model, and directly accessing the flash memory to confirm the sector structure. See for example, Japanese Patent Application 2004-94342. Verifying the sector structure using such methods enables always knowing the actual sector structure when accessing a flash ROM device, and thus prevents accidentally erasing or reading the wrong data.

The data processing device must know the sector structure of the flash ROM device, including the size and location of each sector in the flash ROM device, in order to erase data. As a result, the firmware provided in a data processing device must be designed with an awareness of the sector structure of the flash ROM used in the data processing device.

As shown in FIG. 2, for example, the first 64 KB in 8-Mbit flash ROM device 110 and 16-Mbit flash ROM device 120 is sequentially divided into four sectors of 16 KB, 8 KB, 8 KB, and 32 KB. Erasing the first 8 Mbit of data can therefore be completed by erasing and verifying each of the four sectors in a total of four erase/verify operations. The first 64 KB in a 32-Mbit flash ROM device 130, however, is divided into eight 8-KB sectors, thus requiring eight erase/verify operations. The developer must therefore always be aware of the sector structure and implement an erasing method that matches the sector structure.

SUMMARY

The present invention provides a data processing device having flash ROM that can erase data in sectors of the flash ROM without knowing the sector structure, and provides a method for erasing data in a flash ROM device.

(1) A data processing device according to a first version of the invention has flash ROM with a plurality of sectors, and a CPU for erasing data stored in a predetermined area in flash ROM where a plurality of erase areas is set in flash ROM based on the sector structures of plural different flash ROM devices, and the CPU erases data in each erase area in flash ROM.

(2) A data processing device according to a second version of the invention is the data processing device according to the first version wherein when the value of the first address is the same in the plural flash ROM devices, and the first address and last address of a particular sector in each flash ROM device are the same in all flash ROM devices, the space from the first address to the last address is set as one erase area.

(3) A data processing device according to a third version of the invention is the data processing device according to the first or second version wherein each time the CPU erases data from an erase area, the CPU verifies whether data was erased from the erase area.

(4) A data processing device according to a fourth version of the invention is the data processing device according to any one of the first to third version of the invention wherein a plurality of verification areas is set in flash ROM based on the sector structures of a plurality of flash ROM devices; and each time the CPU erases data from an erase area, the CPU determines whether data was erased from the erase area by verifying at least one address in the verification areas.

(5) A data processing device according to a fifth version of the invention is the data processing device according to any one of the first to fourth version of the invention wherein the verification areas are set based on the greatest common denominator of sector size in plural types of flash ROM devices.

(6) A data processing device according to a sixth version of the invention is the data processing device according to the fourth version of the invention wherein the CPU executes an erase routine for erasing data in an erase area, and an erase verification routine for verifying erasure of the erase area erased by the erase routine, and the erase verification routine executes the erase process and erase verification process at a predetermined interval.

(7) Another version of the invention is a flash ROM data erasing method for erasing data from flash ROM having a plurality of sectors where a plurality of erase areas is set in flash ROM based on the sector structures of a plurality of flash ROM devices, comprising steps of: erasing data using the flash ROM erase areas; and verifying whether data was erased from the erase area each time data is erased from an erase area.

(8) A flash ROM data erasing method according to an eighth version of the invention is the flash ROM erasing method according to the seventh version of the invention wherein when the value of the first address is the same in the plural flash ROM devices, and the first address and last address of a particular sector in each flash ROM device are the same in all flash ROM devices, the space from the first address to the last address is set as one erase area.

(9) A flash ROM data erasing method according to a ninth version of the invention is the flash ROM erasing method according to the seventh or eighth version of the invention wherein a plurality of verification areas is set in flash ROM based on the sector structures of a plurality of flash ROM devices; and each time the CPU erases data from an erase area, the verifying step determines whether data was erased from the erase area by verifying at least one address in the verification areas.

(10) A flash ROM data erasing method according to a tenth version of the invention is the flash ROM erasing method according to any of the seventh to ninth versions of the invention wherein the verification areas are set based on the greatest common denominator of sector size in plural types of flash ROM devices.

(11) A flash ROM data erasing method according to an eleventh version of the invention is the flash ROM erasing method according to any of the seventh to tenth version of the invention wherein the verifying step is executed at a predetermined interval after the erasing step.

A data processing device according to the present invention has flash ROM having a plurality of sectors, and a CPU for erasing data stored in a predetermined area of the flash ROM. The flash ROM has a plurality of erase areas set based on the sector structures of a plurality of flash ROM devices, and the CPU erases data using the flash ROM erase areas.

As a result, once the flash ROM erase routine is written for one product, the same erase routine can be reused when developing new products without needing to write a new erase routine specifically for the flash ROM used in the new product. The utility of an erase routine written in firmware is thus greatly improved and development costs can be reduced.

Verification areas can also be separately defined for determining if data was erased by confirming if the verification address set in a particular verification area is erased. Verifying data erasure can also be completed quickly without confirming the value of every address.

Yet further, by using the largest sector size common to the plural different flash ROM devices that can be used in the data processing device to set the verification areas, whether data at one address in each sector contained in the erased area was erased can be automatically determined regardless of the type of flash ROM, and processing speed can be increased.

The invention further preferably separates operation into an erase routine and an erase verification routine, and runs the erase process by executing the erase verification routine at a predetermined interval. The erase process can therefore be executed without delaying execution of other processes as a result of dedicating CPU power for a short time to the erase process, or more specifically causing the CPU to wait several hundred milliseconds for data erasure as though in an infinite loop.

Other objects and attainments together with a fuller understanding of the invention will become apparent and appreciated by referring to the following description and claims taken in conjunction with the accompanying drawings.

DESCRIPTION OF EMBODIMENTS

Preferred embodiments of a data processing device having flash ROM and a flash ROM data erasing method according to the present invention are described below with reference to the accompanying figures.

A first embodiment of a data processing device having a flash ROM device and a flash ROM data erasing method according to the present invention are described first below.

Figure 1:
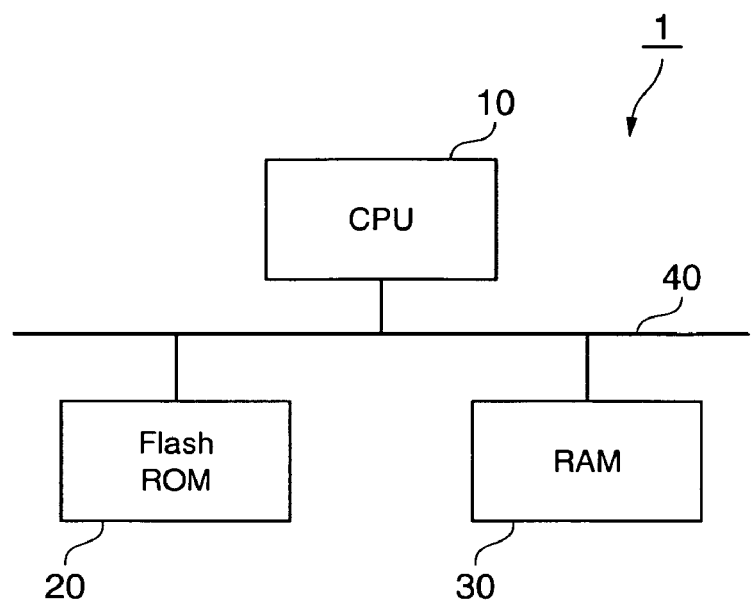
FIG. 1 is a schematic block diagram of a data processing device according to first, second, and third embodiments of the invention.

FIG. 1 is a schematic block diagram of a data processing device according to the invention.

This data processing device 1 has a CPU 10 as the main controller, flash ROM 20, which is rewritable non-volatile memory, and RAM 30, which is volatile memory. FIG. 1 shows only the CPU 10, flash ROM 20, and RAM 30 that are required to describe the present invention, and it will be obvious that various interfaces (internal and external interfaces), operating units, display units, and mechanical assemblies (such as a printing mechanism, scanner, large capacity hard disk drive, and an optical disc drive) can be connected via an internal bus 40 according to the application and type of data processing device 1.

Firmware is stored in flash ROM 20 in this embodiment of the invention. The firmware is a control program for controlling the data processing device 1. The CPU 10 reads and executes this firmware to control the other parts of the data processing device 1 in order to perform specific operations, such as printing if the data processing device 1 is a printer and image scanning if the data processing device is a scanner. References below such as the "firmware processes" or the "firmware executes" mean that the CPU 10 runs the firmware to process data or execute an operation.

The firmware in this embodiment of the invention includes a flash ROM erasing program (erase routine) for erasing flash ROM. "Erasing" as used herein means setting all addresses to FFFFh, thereby enabling writing data to each address. The CPU 10 erases the flash ROM by executing this flash ROM erasing program.

The flash ROM erasing method of this embodiment is described next.

The flash ROM erasing method according to this embodiment of the invention first considers the ROM size and the ROM sector structure, and if the type of flash ROM that was considered is used, data is erased using the same erasing method regardless of the flash ROM type.

Figure 2:
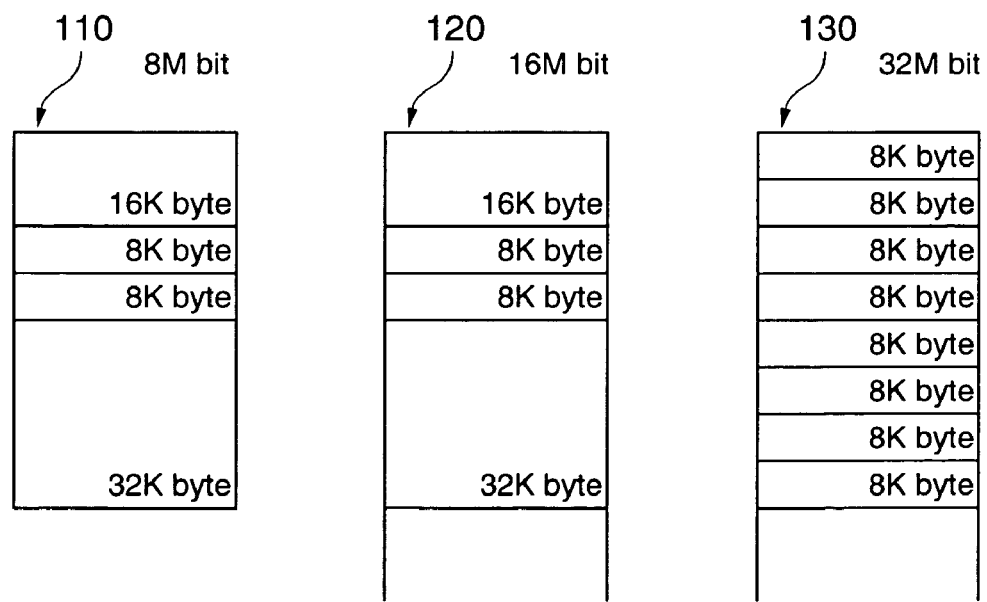
FIG. 2 is a schematic diagram showing the sector structure of flash ROM devices.

More specifically, the flash ROM erasing method of this embodiment of the invention first analyzes the sector structure of the flash ROM to which the erasing method is applied. For example, if the erasing method of this embodiment is applied to 8-Mbit flash ROM device 110, 16-Mbit flash ROM device 120, and 32-Mbit flash ROM device 130 as shown in FIG. 2, the sector structure is the same in the first 64 KB in flash ROM 110 and flash ROM 120.

The sector structure of flash ROM 110 differs from the sector structure of flash ROM 130, however, in that all sectors in flash ROM 130 are 8 KB. However, by treating the first two sectors as one 16-KB sector, and the four sectors from sector 5 to sector 8 as one 32-KB sector, flash ROM 130 can be handled as having the same sector structure as flash ROM 110.

Figure 3:
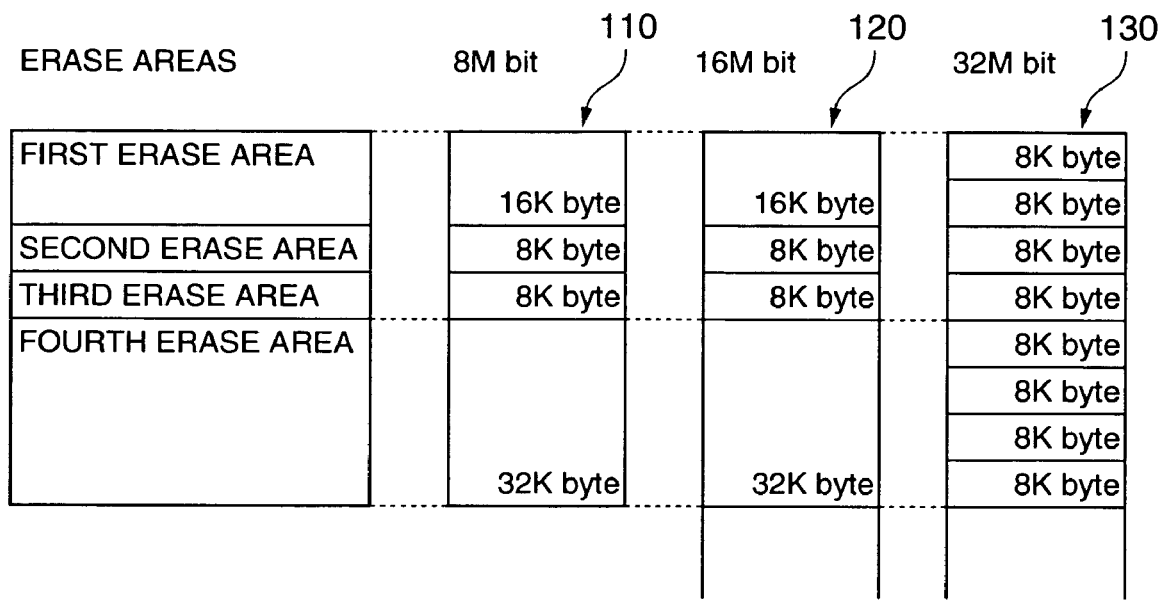
FIG. 3 is a schematic diagram showing the flash ROM erase areas.

This ability to group sectors into a common structure is used in this embodiment of the invention to erase these three different flash ROM devices 110, 120, 130 in the same way as shown in FIG. 3. More specifically, whether erasing flash ROM 110, 120, or 130, the first erase operation sets an erase area (first erase area) enabling erasing and verifying the first 16 KB, the second erase operation sets an erase area (second erase area) enabling erasing and verifying the next 8 KB, the third erase operation sets an erase area (third erase area) enabling erasing and verifying the next 8 KB, and the next erase operation sets an erase area (fourth erase area) enabling erasing and verifying the next 32 KB. The method of the invention does not set these erase areas by specifying sectors. Instead, this embodiment of the invention specifies the area in flash ROM to be erased by specifying the start address and end address of the erase area so that all data in the continuous address space of the erase area from the start address to the end address is erased.

When erasing data from flash ROM 130, a single erase operation actually simultaneously or consecutively erases the two 8-KB sectors in the first erase area, and simultaneously or consecutively erases the four 8-KB sectors in the fourth erase area. In terms of erasing control, however, the firmware simply specifies the start address and end address, and erases 16-KB of data and verifies erasing without being aware of the sector structure. By thus writing the erase routine with knowledge of the sector structure, the firmware can erase any type of flash ROM 110, 120, 130 using the same erasing method without being aware of the actual sector structure at the time the erase routine is executed. As a result, the erasing method of the invention can erase 64-KB of data using only four erase and verify steps even when erasing flash ROM 130.

Erasing data in the address space following the first 64 KB in flash ROM 120 and flash ROM 130 is not described in FIG. 3. However, if the sector boundaries are the same in flash ROM 120 and flash ROM 130, that is, if the first address is the same in flash ROM 120 and flash ROM 130, the start address and end address of each subsequent sector will be the same in flash ROM 120 and flash ROM 130, and the same erasing method can be used by similarly setting the address space from the start address to the end address as one erase area.

The erase process executed by the firmware is described next with reference to the flow chart in FIG. 4.

The flash ROM erase areas are set during firmware development based on the sector structure in plural different flash ROM devices, and the start address and end address of each erase area is stored in flash ROM 20, for example, in the data processing device 1. The firmware for erasing data then simply references and addresses the erase areas, and is unaware of the actual sector structure of the flash ROM 20.

More specifically, to erase a particular erase area in flash ROM 20, the start address and end address of the area (a desired area different from a particular erase area) to be erased in flash ROM 20 are specified. The firmware then sets this start address as the erase address adrs (step S1). The erase area containing that erase address adrs is then erased (step S2). After erasing starts and then ends (step S3 returns Yes), control goes to step S4 and the erase address adrs is set to the first address in the erase area.

Whether the value of the erase address adrs is FFFFh is then determined, that is, whether erasing was completed is verified (step S5). If data at the address was erased (step S5 returns Yes), step S6 determines if the erase address adrs is equal to the end address. If the erase address adrs equals the end address (step S6 returns Yes), the erase process ends. If the erase address adrs does not equal the end address, the erase address adrs is incremented to the next address and step S5 repeats.

There are situations in which the erase address adrs has not been cleared in step S5. A first situation is when erasing failed for some reason. A second situation is when the start address and end address are in different erase areas, only the erase area containing the start address has been cleared, and an address in the area that has not been erased is set to erase address adrs.

In either situation, if the erase address adrs is not cleared, control loops back to step S2 and the process repeats from step S2. If the first situation applies, data in an erase area thought to have already been erased is erased again in step S2. If the second situation applies, data in the erase area following the erase area that was previously erased is erased in step S2.

Figure 4:
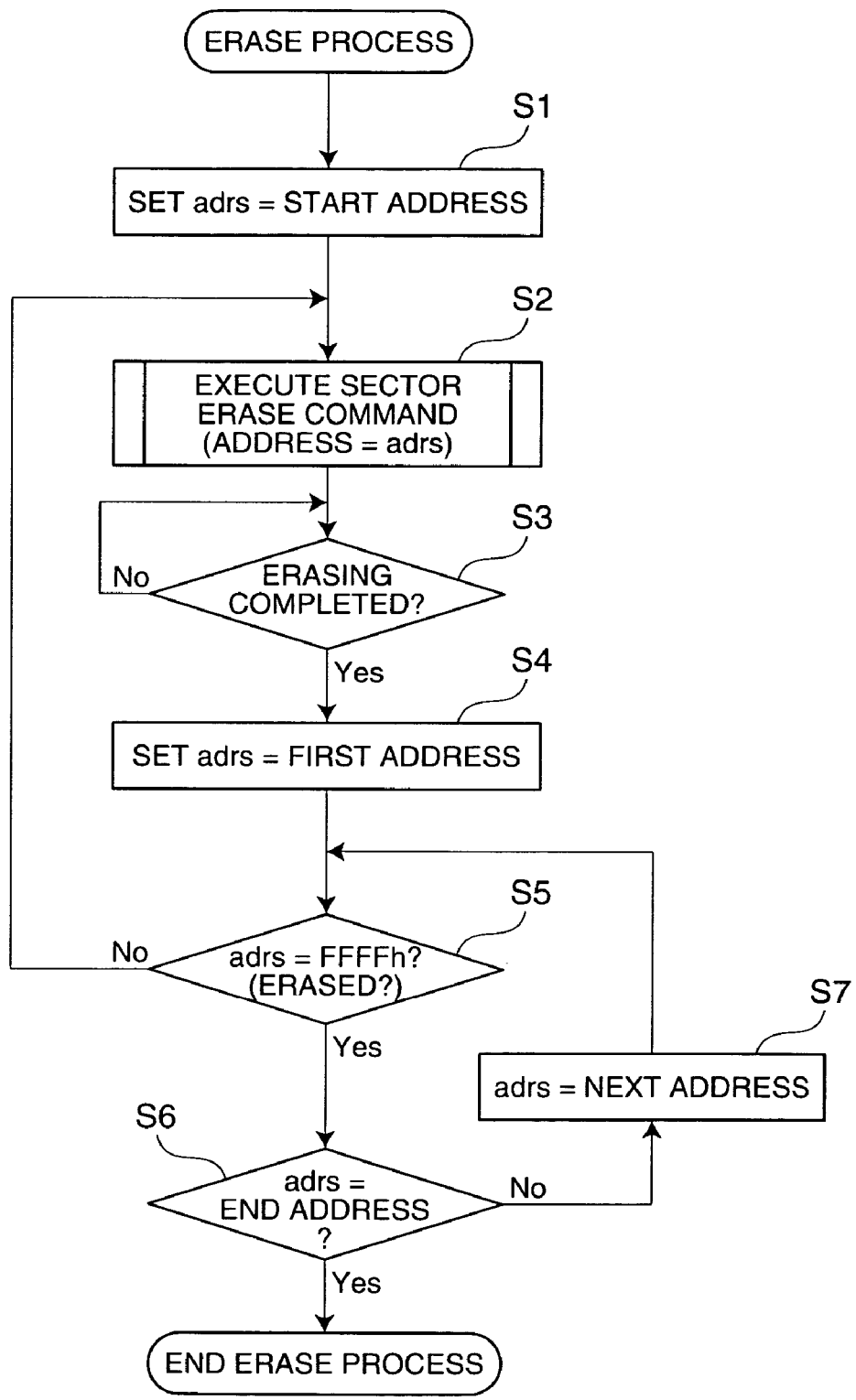
FIG. 4 is a flow chart describing the erase process in a first embodiment of the invention.

Ultimately, whether or not the start address and end address are in different erase areas and a plurality of erase areas is cleared, executing the method shown in the flow chart in FIG. 4 erases all data in the continuous erase area from the erase area containing the start address to the erase area containing the end address.

As will be understood from the foregoing description, the firmware in this embodiment of the invention is aware of the relationship between the erase areas, the start address, and the end address when erasing data, but is completely unaware of the actual sector structure when erasing data. Regardless of the sector structure of the flash ROM being used, this embodiment of the invention can therefore reliably erase a flash ROM device if the erasing method itself is written with an awareness of the sector structure of the flash ROM devices that can be used. As a result, once the erase routine of the firmware is written to accommodate the different sector structures of the flash ROM devices that can be used, the same erase routine can be reused in data processing devices of various types. The utility of the firmware erase routine is therefore improved, and development costs can be reduced.

A second embodiment of a data processing device having a flash ROM device and a flash ROM data erasing method according to the present invention are described first below.

The erasing method according to this second embodiment of the invention erases data in the same way as in the first embodiment. This embodiment differs from the first embodiment in the method of verifying data erasure. The method of the first embodiment verifies data erasure at all addresses from the first address in the erase area containing the start address to the end address. Instead of verifying erasure for all addresses, this second embodiment sets a verification area separately from the erase area, and verifies data erasure for each verification area.

Figure 5:
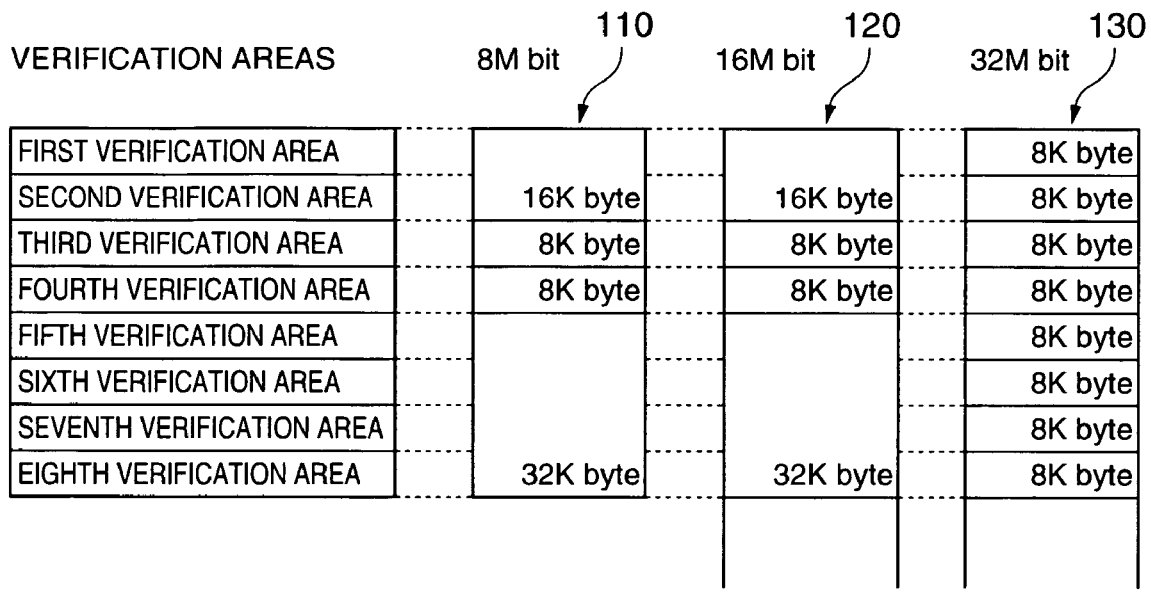
FIG. 5 is a schematic diagram showing flash ROM verification areas.

As shown in FIG. 5 these verification areas are units for verifying erasure after data is erased. After erasing each erase area ends in this embodiment of the invention, the firmware verifies erasure of the corresponding verification area by confirming if the value of the initial address (a value other than FFFFh) that was written to each verification area before erasing begins has been erased. That is, instead of verifying erasure for all addresses, this embodiment of the invention groups the address space inside the erase area into verification areas, and verifies whether a verification area has been erased by confirming if the address of the verification area (verification address) has been erased.

Similarly to the erase areas, the verification areas in this embodiment are determined based on the common features of the flash ROM devices that are expected to be used. Unlike the erase areas, however, the verification areas are defined using the largest sector size that is common to all flash ROM devices that will be used in the data processing device. If the data processing device can use flash ROM devices 110, 120, or 130 as described above, the size of the verification areas is set to the greatest common denominator, that is, 8 KB, because these flash ROM devices have sectors of 8 KB, 16 KB, and 32 KB.

The verification areas in this process are used to confirm whether the sectors contained in at least the area to be erased were erased regardless of the type of flash ROM used. More specifically, by setting the verification areas to the largest sector size that is common to all flash ROM devices that will be used in the data processing device, whether data was erased can be verified for one address in each sector regardless of whether flash ROM device 110, 120, or 130 is used, and verifying erasure of this one address can be used to determine if the sectors contained in the area being erased were actually erased.

The erase process executed by the firmware in this embodiment of the invention is described next with reference to the flow chart in FIG. 6.

More specifically, to erase a particular erase area in flash ROM 20, the start address and end address of the area (a desired area different from a particular erase area) to be erased in flash ROM 20 are specified. The firmware then divides the area between the erase area containing the start address and the erase area containing the end address into units of the smallest possible sector size (8 KB assuming flash ROM devices 110, 120, 130) to set the verification areas (step S11).

The first address that is not FFFFh (not erased) is then found in each verification area and stored as the verification address (step S12).

The first address in the first verification area (that is, the verification area at the beginning of the erase area) is then set as erase address adrs (step S13). The erase area containing that erase address adrs is then erased (step S14). After erasing starts and then ends (step S15 returns Yes), control goes to step S16 to determine if the value of the verification address of the first verification area, which is the verification area that was just set, is FFFFh, that is, has been erased (step 16). If the verification address was erased (step 16 returns Yes), step S17 determines if the verification area containing this verification address is the last verification area. If the verification area containing the verification address is the last verification area (step 17 returns Yes), the erase process ends. If the verification area containing the verification address is not the last verification area (step 17 returns No), the verification area is changed to the next verification area (step S18), control returns to step S16, and the process repeats.

There are situations in which the verification address of the verification area has not been cleared in step S16. A first situation is when erasing failed for some reason. A second situation is when the start address and end address are in different erase areas, only the erase area containing the start address has been cleared, and the verification address for a verification area contained in an erase area that has not been erased, that is, the next erase area, was checked.

In either situation, if the verification address is not cleared, control goes to step S19, the erase address adrs is set to the first address in the current verification area, and the process repeats from step S14. If the first situation applies, data in an erase area thought to have already been erased is erased again in step S14. If the second situation applies, data in the erase area following the erase area that was previously erased is erased in step S14.

Figure 6:
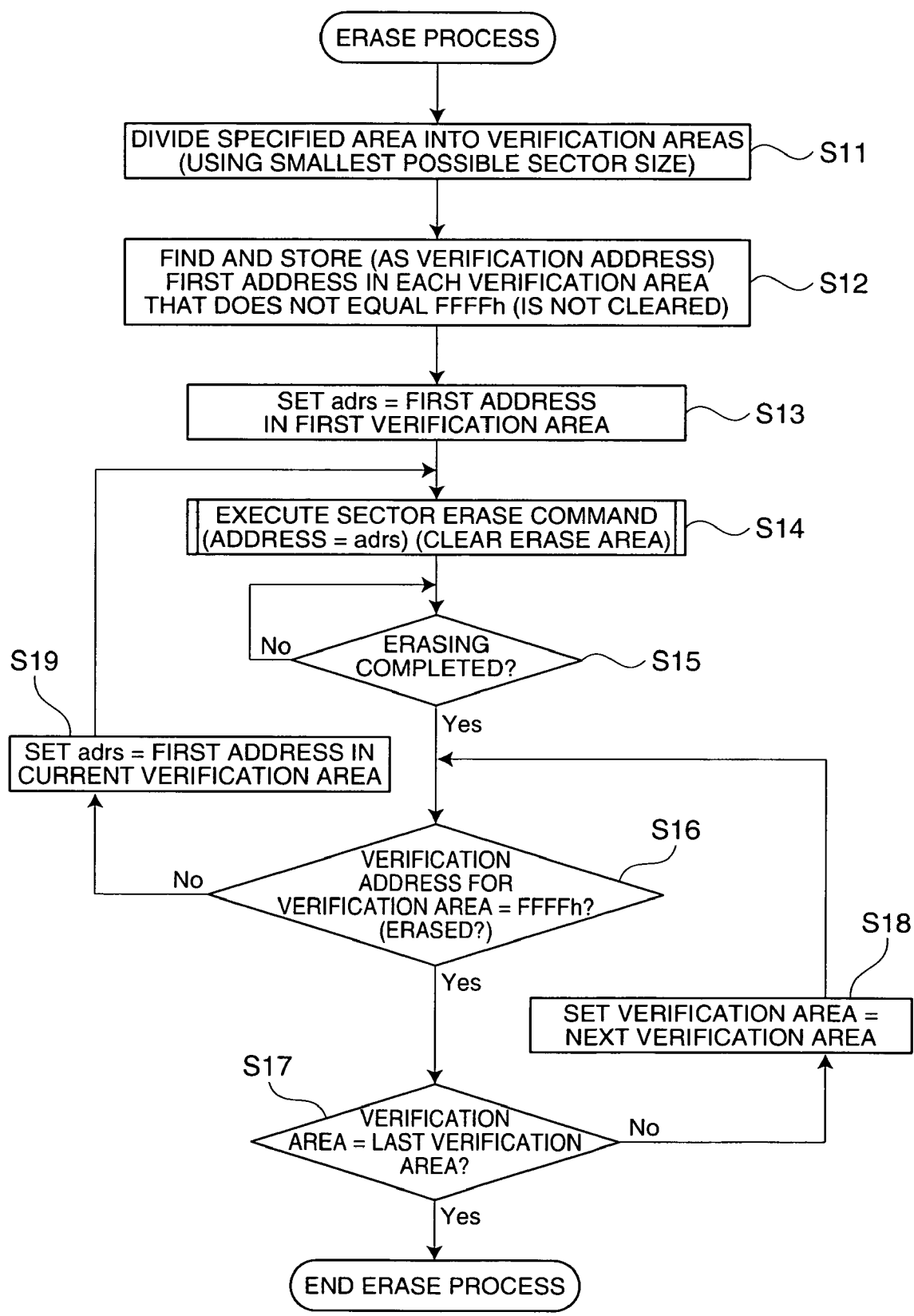
FIG. 6 is a flow chart describing the erase process in a second embodiment of the invention.

Ultimately, whether or not the start address and end address are in different erase areas and a plurality of erase areas is cleared, executing the method shown in the flow chart in FIG. 6 erases all data in the continuous erase area from the erase area containing the start address to the erase area containing the end address.

As will be understood from the foregoing description, as in the first embodiment, the firmware in this embodiment of the invention is aware of the relationship between the erase areas, the start address, and the end address when erasing data, but is completely unaware of the actual sector structure when erasing data. Regardless of the sector structure of the flash ROM being used, this embodiment of the invention can therefore reliably erase a flash ROM device if the erasing method itself is written with an awareness of the sector structure of the flash ROM devices that can be used. As a result, once the erase routine of the firmware is written to accommodate the different sector structures of the flash ROM devices that can be used, the same erase routine can be reused in data processing devices of various types. The utility of the firmware erase routine is therefore improved, and development costs can be reduced.

In addition, this embodiment separately defines verification areas and verifies whether data was erased by confirming if the verification address set for each verification area has been erased. Compared with verifying the value of all addresses as in the first embodiment, this embodiment of the invention can increase the speed of the erasure verification process.

Furthermore, by using the largest sector size that is common to all usable types of flash ROM devices to set the verification areas, whether data has been erased at one address in each sector contained in the erased area can be automatically verified regardless of the type of flash ROM used, thus accelerating the erase process and improving the reliability of erasure verification. The utility of the erase routine is also improved because the process can run without the firmware knowing the actual sector structure of the flash ROM device.

The verification address is described as one address above, but the invention is not so limited. More specifically, a plurality of addresses in each verification area can be verified. However, verifying at least one address enables verifying whether the data in each sector was erased.

A third embodiment of a data processing device having a flash ROM device and a flash ROM data erasing method according to the present invention are described first below.

The erasing method of this third embodiment of the invention is conceptually the same as the erasing method of the second embodiment in that two units, erase areas and verification areas, are used for erasing data and verifying erasure. This embodiment differs by executing the erase and erase verification operations as interrupt processes, thereby distributing the processing load on the data processing device 1 over time.

The erase process executed by the firmware in this embodiment of the invention is described below with reference to the flow chart shown in FIG. 7.

In the erasing method according to this embodiment, the firmware has an erase routine that governs the overall erase and verify process, and an erase verification routine that is an interrupt process activated separately from and complements the erase routine.

More specifically, to erase a particular erase area in flash ROM 20, the start address and end address of the area (a desired area different from a particular erase area) to be erased in flash ROM 20 are specified. The firmware then calls the erase routine and divides the area between the erase area containing the start address and the erase area containing the end address into units of the smallest possible sector size (8 KB assuming flash ROM devices 110, 120, 130) to set the verification areas (step S21).

The first address that is not FFFFh (not erased) is then found in each verification area and stored as the verification address (step S22).

The first address in the first verification area (that is, the verification area at the beginning of the erase area) is then set as erase address adrs (step S23). The erase area containing that erase address adrs is then erased (step S24). The erase routine then sleeps until a termination notice is received from the erase verification routine (step S25). The erase routine ends when the termination notice is received.

The erase verification routine is activated separately from the erase routine and runs at a predetermined interval. More specifically, completion of the erase process in step S24 of the erase routine is first confirmed when the erase verification routine (erase routine) starts (step S31). If erasing is not completed, operation pauses for a predetermined period and then returns to step S31. If the erase process is completed in step S31 (step S31 returns Yes), control goes to step S32 to determine if the value of the verification address of the first verification area, which is the verification area that was just set, is FFFFh, that is, has been erased (step 32).

If the verification address was erased (step 32 returns Yes), step S33 determines if the verification area containing this verification address is the last verification area. If the verification area containing the verification address is the last verification area (step 33 returns Yes), a termination notice is sent to the erase process. If the verification area containing the verification address is not the last verification area (step 33 returns No), the verification area is changed to the next verification area (step S34), control returns to step S32, and the process repeats.

There are situations in which the verification address of the verification area has not been cleared in step S32. A first situation is when erasing failed for some reason. A second situation is when the start address and end address are in different erase areas, only the erase area containing the start address has been cleared, and the verification address for a verification area contained in an erase area that has not been erased, that is, the next erase area, was checked.

In either situation, if the verification address is not cleared, control goes to step S35, the erase address adrs is set to the first address in the current verification area, the erase area containing the erase address adrs is erased (step S36), operation then pauses for a predetermined period, and control again returns to step S31.

If the first situation applies, data in an erase area thought to have already been erased is erased again in step S36. If the second situation applies, data in the erase area following the erase area that was previously erased is erased in step S36.

Figure 7:
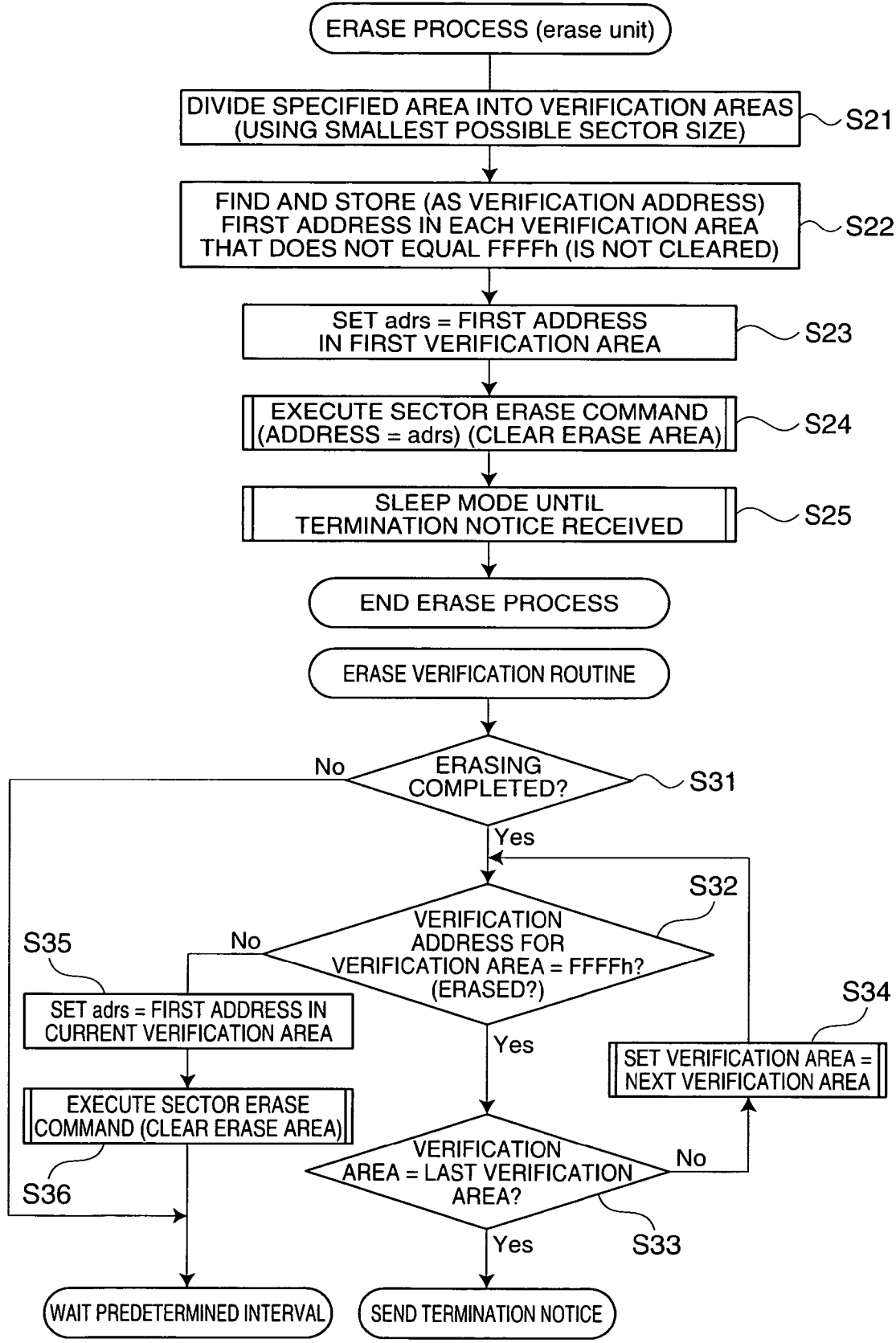
FIG. 7 is a flow chart describing the erase process in a third embodiment of the invention.

Ultimately, whether or not the start address and end address are in different erase areas and a plurality of erase areas is cleared, executing the method shown in the flow chart in FIG. 7 erases all data in the continuous erase area from the erase area containing the start address to the erase area containing the end address.

As will be understood from the foregoing description, as in the first embodiment, the firmware in this embodiment of the invention is aware of the relationship between the erase areas, the start address, and the end address when erasing data, but is completely unaware of the actual sector structure when erasing data. Regardless of the sector structure of the flash ROM being used, this embodiment of the invention can therefore reliably erase a flash ROM device if the erasing method itself is written with an awareness of the sector structure of the flash ROM devices that can be used. As a result, once the erase routine of the firmware is written to accommodate the different sector structures of the flash ROM devices that can be used, the same erase routine can be reused in data processing devices of various types. The utility of the firmware erase routine is therefore improved, and development costs can be reduced.

In addition, this embodiment separately defines verification areas and verifies whether data was erased by confirming if the verification address set for each verification area has been erased. Compared with verifying the value of all addresses as in the first embodiment, this embodiment of the invention can increase the speed of the erasure verification process.

Furthermore, by using the largest sector size that is common to all usable types of flash ROM devices to set the verification areas, whether data has been erased at one address in each sector contained in the erased area can be automatically verified regardless of the type of flash ROM used, thus accelerating the erase process and improving the reliability of erasure verification.

Furthermore, by separating the erase routine from the erase verification routine and executing the erase verification routine at a predetermined interval, the method of this embodiment executes a process equivalent to the process of the second embodiment. Problems resulting from CPU power being allocated for a short time to the erase process and thus slowing the overall processing speed and delaying execution of other processes can thus be avoided while executing the erase process.

The present invention is not limited to flash ROM and can be used with any type of nonvolatile memory that is internally divided into a plurality of sectors.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A data processing device comprising:
   flash read only memory (ROM) having a plurality of sectors; and
   a central processing unit (CPU) for erasing data stored in a predetermined area of the flash read only memory (ROM);
   wherein the flash ROM has a plurality of erase areas set based on sector structures of a plurality of types of flash ROM devices; and
   the CPU erases data using the flash ROM erase areas;
   wherein when the value of a first address is the same in the plurality of types of flash ROM devices, and the first address and a last address of a particular sector in each flash ROM device are the same in all flash ROM devices, the space from the first address to the last address of the particular sector is set as one erase area.

2. The data processing device described in claim 1, wherein each time the CPU erases data from an erase area, the CPU verifies whether data was erased from the erased erase area.

3. The data processing device described in claim 1, wherein:
   a plurality of verification areas is set in flash ROM based on the sector structures of the plurality of types of flash ROM devices; and
   each time the CPU erases data from an erase area, the CPU determines whether data was erased from the erased erase area by verifying at least one address in the verification areas.

4. The data processing device described in claim 3, wherein: the verification areas are set based on a greatest common denominator of sector size in the plurality of types of flash ROM devices.

5. The data processing device described in claim 3, wherein:
the CPU executes an erase routine for erasing data in an erase area, and an erase verification routine for verifying erasure of the erase area erased by the erase routine; and
the CPU executes the erase routine and erase verification routine at a predetermined interval; and
the verification areas are set based on a largest sector size common to all usable plurality of types of flash ROM devices.

6. A flash read only memory (ROM) data erasing method for erasing data from flash ROM having a plurality of sectors where a plurality of erase areas is set in flash ROM based on the sector structures of a plurality of types of flash ROM devices, comprising:
erasing data using the plurality of erase areas; and
verifying whether data was erased from the plurality of erase areas each time data is erased from at least one of the plurality of erase areas;
wherein when the value of a first address is the same in the plurality of types of flash ROM devices, and the first address and a last address of a particular sector in each flash ROM device are the same in all flash ROM devices, the space from the first address to the last address of the particular sector is set as one erase area.

7. The flash ROM data erasing method described in claim 6, wherein:
a plurality of verification areas is set in flash ROM based on the sector structures of the plurality of types of flash ROM devices; and
each time a central processing unit (CPU) erases data from an erase area, the verifying step determines whether data was erased from the erased erase area by verifying at least one address in the verification areas.

8. The flash ROM data erasing method described in claim 7, wherein:
the plurality of verification areas are set based on a greatest common denominator of sector size in the plurality of types of flash ROM devices.

9. The flash ROM data erasing method of claim 8, further comprising:
specifying a start address and an end address of the flash ROM erase areas; and
dividing the flash ROM erase areas into units having a smallest possible size.

10. The flash ROM data erasing method of claim 8, further comprising:
specifying a start address and an end address of at least one of the plurality of erase areas;
dividing the erase areas into units having a smallest possible size;
finding in each verification area a first address that is not erased and storing said first address that is not erased as a verification address;
erasing at least one of a plurality of erase areas of a first verification area; and
performing an erase verification routine, which determines whether a verification address for each verification area has been erased.

11. The flash ROM data erasing method of claim 10, wherein the step of erasing at least one of a plurality of erase areas and the erase verification routine are performed separately.

12. The flash ROM data erasing method described in claim 6, wherein the verifying step is executed at a predetermined interval after the erasing step.

13. A flash read only memory (ROM) data erasing method for erasing data from flash ROM having a plurality of sectors where a plurality of erase areas is set in flash ROM based on the sector structures of a plurality of types of flash ROM devices, comprising:
erasing data using the plurality of erase areas;
verifying whether data was erased from at least one of the plurality of erase areas each time data is erased from at least one of the plurality of erase areas;
separately defining verification areas;
verifying whether data was erased by confirming if a verification address set for each verification has been erased;
wherein when the value of a first address is the same in the plurality of types of flash ROM devices, and the first address and a last address of a particular sector in each flash ROM device are the same in all flash ROM devices, the space from the first address to the last address of the particular sector is set as one erase area.

* * * * *